United States Patent [19]
Ohta

[11] Patent Number: 4,683,524
[45] Date of Patent: Jul. 28, 1987

[54] ILLUMINATION APPARATUS

[75] Inventor: Masakatsu Ohta, Tokyo, Japan

[73] Assignee: Canon Kabushiki Kaisha, Tokyo, Japan

[21] Appl. No.: 919,377

[22] Filed: Oct. 16, 1986

Related U.S. Application Data

[63] Continuation of Ser. No. 720,610, Apr. 8, 1985, abandoned.

[30] Foreign Application Priority Data

Apr. 13, 1984 [JP] Japan .................... 59-75388

[51] Int. Cl.$^4$ .................... F21V 7/04; G03B 27/02
[52] U.S. Cl. .................... 362/268; 362/32; 350/96.24; 350/96.25; 355/78
[58] Field of Search ............... 362/268, 32; 350/96.24, 350/96.25; 355/67, 70, 71, 78, 132, 133

[56] References Cited

U.S. PATENT DOCUMENTS

| | | |
|---|---|---|
| 3,795,446 | 5/1974 | Houston . |
| 3,815,493 | 6/1974 | Tarabocchia .................... 355/78 |
| 3,941,475 | 3/1976 | Sheets .................... 355/78 |
| 3,981,590 | 9/1976 | Perkins .................... 350/96.24 |
| 3,988,066 | 10/1976 | Suzuki et al. . |
| 4,023,904 | 5/1977 | Sheets .................... 355/78 |
| 4,241,392 | 12/1980 | Boone .................... 355/67 |
| 4,375,315 | 3/1983 | Lacombat et al. . |
| 4,441,817 | 4/1984 | Pryer .................... 350/96.24 |
| 4,497,013 | 1/1985 | Ohta .................... 362/32 |
| 4,523,806 | 6/1985 | Kojima et al. .................... 350/96.25 |

FOREIGN PATENT DOCUMENTS 56-813  4/1981  Japan .

Primary Examiner—Raymond A. Nelli
Attorney, Agent, or Firm—Fitzpatrick, Cella, Harper & Scinto

[57] ABSTRACT

An illumination apparatus for illuminating a surface, having formed thereon a pattern, to transfer the pattern onto a semiconductor wafer. The apparatus includes an elliptic mirror for forming an image of a light source, an imaging system for re-imaging the image of the light source, formed by the elliptical mirror, while causing a curvature of field, a multi-beam generating system disposed relative to the imaging system so that the optimum focus located at the off-axis position of the imaging system is coincident with an input surface of the multi-beam generating system, and a collimator for directing to the pattern surface a number of discrete light beams generated by the multi-beam generating system to illuminate the pattern surface. Whereby a uniform intensity distribution of the light illuminating the pattern surface and a high light-collecting efficiency are assured.

8 Claims, 4 Drawing Figures

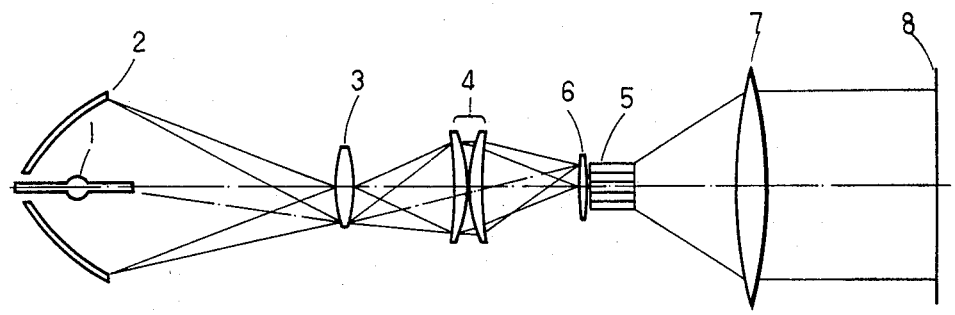
F I G.1
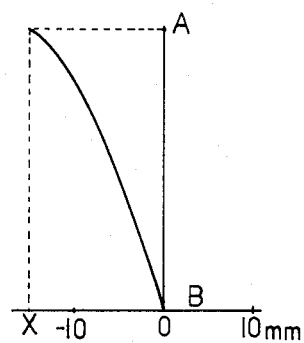
F I G.2

ILLUMINATION APPARATUS

This application is a continuation of application Ser. No. 720,610 filed Apr. 8, 1985, now abandoned.

BACKGROUND OF THE INVENTION

This invention relates to an apparatus for illuminating an area of a particular range and, more particularly, to an apparatus for illuminating a photomask or reticle having an integrated circuit pattern during a step for transferring the pattern onto a semiconductor wafer.

Manufacture of semiconductor devices such as integrated circuits involves pattern transfer steps relative to the same semiconductor wafer for superposing, on the semiconductor wafer in a predetermined sequence, the patterns formed on various photomasks or reticles. The pattern transfer step is carried out by illuminating the photomask or reticle (which hereinafter will be referred to simply as "mask") held in contact with or in close proximity to the wafer having on its surface a sensitive layer or by illuminating the pattern which is located at a position optically conjugate with the sensitive layer on the wafer with respect to a refraction type or reflection type projection lens system.

Since the pattern transfer is effected by the illumination of the pattern, the image quality of the pattern transferred onto the wafer is affected to a great extent by the performances of the illumination apparatus for illuminating the mask. In view of this, many proposals have been made with reference to the illumination apparatus, such as disclosed in U.S. Pat. No. 3,795,446 issued Mar. 5, 1974, U.S. Pat. No. 3,988,066 issued Oct. 26, 1976 and U.S. Pat. No. 4,375,315 issued Mar. 1, 1983 and Japanese Laid-Open patent application No. 81813/1981 laid open July 4, 1981.

Essential considerations for the illumination apparatus to be used in transferring the integrated circuit pattern onto the semiconductor wafer are as follows:

(1) Removal of unevenness in the illuminance on the mask surface;

(2) Improvement of the illuminance; and (3) Achieving an appropriate angle of incidence of the light beam incident on the mask surface.

In order to remove the unevenness in the illuminance (Item 1), it has been proposed to use a multi-beam generating member. The multi-beam generating member comprises a fly's eye lens (compound eye lens), an optical element formed by a bundle of self-converging fibers or a bundle of ordinary fibers, or a combination of radially disposed prisms. By such multi-beam generating member, a number of descrete light beams (fluxes) are generated, which beams are collimated by a collimator so that they are integrated on the pattern surface. By doing so, the illuminance unevenness is maintained within a range of ±2-3%. The improvement of illuminance (Item 2) has been promoted by increasing the light-collecting efficiency or by increasing the luminance of the light source. The appropiate angle of incidence of the light beam (Item 3) has been attained by selecting the diameter of the multi-beam generating member and the focal length of the collimation lens.

In addition to the above-described requirements, attention has recently been paid to uniformity of intensity distribution of the light beam impinging on the mask surface. The inventor of the present invention has already proposed in U.S. patent application Ser. No. 508,333 filed June 27, 1983, corresponding to Japanese patent application No. 115846/1982 filed July 2, 1982, an illumination apparatus wherein a plurality of multi-beam generating members are disposed in the path of illumination downstream of an elliptical reflecting mirror in order to compensate for an uneven intensity distribution which is produced in the image of the light source formed by the elliptical reflecting mirror, to thereby assure uniform intesity distribution of the light beam impinging on the pattern surface. Since, however, the multi-beam generating member causes approximately 20-40% loss in the light quantity, use of plural multi-beam generating members inevitably decreases the collecting efficiency.

SUMMARY OF THE INVENTION

It is accordingly a primary object of the present invention to provide an illumination apparatus wherein both a high collecting efficiency and uniformity in the intensity distribution of the light beam are assured.

It is another object of the present invention to provide an illumination apparatus capable of attaining a desired intensity distribution of the light beam.

It is a further object of the present invention to provide an illumination apparatus suitable for use in the illumination of an integrated circuit pattern to transfer the pattern onto a semiconductor wafer.

Briefly, according to the present invention, there is provided an illumination apparatus, comprising a light source; an elliptical mirror for forming an image of the light source; an imaging system for re-imaging the image formed by the elliptical mirror, while causing a curvature of field; a multi-beam generating system for producing, from a light beam emitted from the light source, a number of discrete light beams, the multi-beam generating system having an input surface disposed in a predetermined relation to the image of the light source formed by the imaging system; and a collimating system for collimating each of the discrete light beams emerging from the multi-beam generating system.

In accordance with another aspect of the present invention, there is provided an illumination apparatus for illuminating a surface, having formed thereon a pattern, to transfer the pattern onto a semiconductor wafer. The apparatus includes an elliptic mirror for forming an image of a light source, an imaging system for re-imaging the image of the light source, formed by the elliptical mirror, while causing a curvature of field, a multi-beam generating system disposed relative to the imaging system so that the optimum focus located at the off-axis position of the imaging system is coincident with an input surface of the multi-beam generating system, and a collimator for directing to the pattern surface a number of discrete light beams generated by the multi-beam generating system to illuminate the pattern surface. Whereby a uniform intensity distribution of the light illuminating the pattern surface and a high light-collecting efficiency are assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view showing an illumination apparatus according to an embodiment of the present invention.

FIG. 2 shows the curvature of field of an imaging lens system employed in an illumination apparatus according to an embodiment of the present invention.

DESCRIPTION OF THE PREFERRED EMBODIMENTS

Figures 3A, 3B:
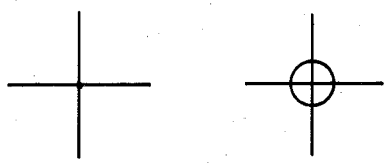
FIGS. 3A and 3B are views showing the light beam incident on an input surface of a multi-beam generating portion at the outermost off-axis position and the on-axis position thereof, as viewed from the illumination light source side.

Referring to FIG. 1, an illumination apparatus according to an embodiment of the present invention includes a light source 1 such as a super Hg lamp, an elliptical reflecting mirror 2 disposed relative to the light source 1 so that the light source 1 is located at a first focal point of the elliptical reflecting mirror 2. A field lens 3 is disposed at a second focal point of the elliptical reflecting mirror 2, i.e., at a position whereat the image of the light source 1 is formed by the elliptical reflecting mirror 2.

The apparatus further includes a multi-beam generating member 5 such as a fly's eye lens (compound eye lens) comprising a bundle of bar lenses, for example. The multi-beam generating member is adapted to produce a number of discrete light beams (fluxes) advancing in different directions. Each bar lens is preferably formed so that a focal point defined by a curved surface of one end thereof is located at a position on the other end of the bar lens. An imaging lens system 4 is provided to re-image the image of the light source 1, formed at the second focal point of the elliptical reflecting mirror 2, on an input surface of the multi-beam generating member 5, i.e., on the plane containing the left-hand side apices of the bar lenses of the multi-beam generating member 5 as viewed in the drawing. The imaging lens system 4 is designed to produce a curvature of field. Details of the function and operation of the imaging lens system 4 will be described later.

The apparatus further includes a second field lens 6 disposed in close proximity to the input surface of the multi-beam generating member 5, and a collimator lens 7 for collimating each of the discrete light beams, produced by the multi-beam generating member 5, and for directing them to a plane 8 so that they are superposed one upon another on the plane 8. The plane 8 is a surface to be illuminated, and in this plane a pattern surface of a mask for the manufacture of integrated circuits or a restriction blade for restricting the area, on the mask, to be illuminated by the light beam emerging from the collimator lens 7 is disposed. In the latter case in which the restriction blade is disposed in the plane 8, an additional imaging system is disposed downstream of the plane 8 to define a plane optically conjugate with the plane 8 and the pattern surface of the mask is disposed in such conjugate plane. A shutter blade for controlling the quantity of light to be applied to the pattern surface of the mask may be disposed in proximity to the field lens 3 or the field lens 6. Where the illumination apparatus of the present embodiment is incorporated into an apparatus for transferring an integrated circuit pattern onto a semiconductor wafer, the wafer is held in contact with or in close proximity to the mask, or the wafer is held at a position optically conjugate with the mask with respect to a projection lens system disposed therebetween.

The imaging lens system 4 is designed to produce a curvature of field as shown in FIG. 2. Such imaging lens system can be easily manufactured by inversely using a well-known aberration correcting techique. In FIG. 2, point A shows the outermost off-axis position while point B shows the on-axis position. It is seen from FIG. 2 that, when the input surface of the multi-beam generating member 5 is disposed in a plane containing the points A and B, there occurs focus deviation Xmm at the outermost off-axis position, i.e. point A. If, on the other hand, the input surface of the multi-beam generating member 5 is disposed in a plane containing the point X and perpendicular to the optical axis, there occurs the same focus deviation Xmm at the on-axis position, i.e., point B. This is shown in FIGS. 3A and 3B. That is, FIG. 3A shows a spot diagram at the outermost off-axis position (point A) on the input surface of the multi-beam generating member 5 in a case where the input surface is disposed in the plane containing the point X, while FIG. 3B shows a spot diagram at the on-axis position (point B) on the input surface of the multi-beam generating member 5 in this case. It will be seen from these Figures that, if the image of the light source 1 formed on the second focal surface of the elliptical reflecting mirror 2 has a uniform intensity distribution, and if the imaging lens system 4 having a property for causing the curvature of field such as shown in FIG. 2 is disposed relative to the multi-beam generating member 5 so that an optimum focus position is defined at the outermost off-axis point A on the input surface of the multi-beam generating member 5, then there is produced on the input surface an intensity distribution wherein the intensity is lower at the central portion (the area around the optical axis) but increases toward the marginal portion (the area at the outermost off-axis position). Thus, any desired intensity distribution can be easily attainable, by a person skilled in the art, by appropriately selecting the curvature of each of the lens elements constituting the imaging lens system 4 and the distance between the surfaces of adjacent lens elements to achieve a desired curvature of field.

Actually, however, the intensity distribution of the image of the light source 1 formed at the focal point of the elliptical reflecting mirror 2 is not even, and the intensity is higher at the central portion and is lower at the marginal portion. Therefore, where the imaging lens system 4 has a curvature of field of such degree which is effective to cancel the difference or variation in the intensity, the intensity distribution of the image of the light source, as formed on the input surface of the multi-beam generating member 5 can be made substantially uniform. Since an intensity distribution the same as that on the input surface of the multi-beam generating member 5 is maintained or reproduced at the output end of the multi-beam generating member 5, the intensity distribution of the light beam impinging on the plane 8 can be made uniform.

While in the illustrated embodiment uniform intensity distribution is aimed at, any other intensity distribution can be defined in the incident light beam according to the present invention by changing one or both of the degree of the curvature of field of the imaging lens system and the position of the multi-beam generating member in the direction of the optical axis. Further, the imaging lens system may be formed by lens elements only or by a combination of an aspherical reflecting mirror with lens elements. Moreover, the multi-beam generating member 5 is not limited to the fly's eye lens. The field lens is provided in order to assure effective utilization of the light quantity and may be omitted. The path of illuminating light may be bent by using a reflecting mirror.

While in the illustrated embodiment a desired intensity distribution is attained by the use of an imaging lens system having a curvature of field, the invention is not limited thereto and substantially the same effects are obtainable with the use of a lens system having an uneven or varying magnification.

In accordance with the present invention, as has hitherto been described, the intensity distribution is remarkably improved with a simple structure. Further, the collecting efficiency 1.2–1.7 times higher than that in a case where two multi-beam generating members are used is achieved. Accordingly, when the illumination apparatus of the present invention is incorporated into a pattern transfer apparatus for use in the manufacture of semiconductor circuit devices, superior pattern transfer is attainable which leads to increased yields of the articles. In addition, owing to the high light-collecting efficiency, the exposure time can be reduced as the result of which the throughput of the apparatus can be improved particularly in a case where the operation is continued throughout a day such as in the field of manufacture of semiconductor circuit devices.

While the invention has been described with reference to the structures disclosed herein, it is not confined to the details set forth and this application is intended to cover such modifications or changes as may come within the purposes of the improvements or the scope of the following claims.

What is claimed is:

1. An illumination apparatus, comprising:
    a light source;
    an elliptical mirror for forming an image of said light source;
    an imaging system for re-imaging the image formed by said elliptical mirror, while causing a curvature of field;
    a multi-beam generating system for producing, from a light beam emitted from said light source, a number of discrete light beams, said multi-beam generating system having an input surface disposed in a predetermined relation to the image of said light source formed by said imaging system; and
    a collimating system for collimating each of the discrete light beams emerging from said multi-beam generating system.

2. An apparatus according to claim 1, wherein an optimum focus point at an off-axis position of said imaging system is located on said input surface of said multi-beam generting system.

3. An apparatus according to claim 2, wherein the optimum focus point at the off-axis position of said imaging system is located at the outermost off-axis portion on said input surface of said multi-beam generating system.

4. An apparatus, comprising:
    a light source;
    an imaging system for forming an image of said light source, while causing a curvature of field;
    a multi-beam generating system for generating, from a light beam emitted from said light source, a number of discrete light beams, said multi-beam generating system having an input surface disposed at an optimum focus point at an off-axis position of said imaging system; and
    a collimating system for collimating each of the discrete light beams emerging from said multi-beam generating system.

5. An apparatus according to claim 4, wherein the outermost off-axis portion of said input surface of said multi-beam generating system is coincident with the optimum focus point at the off-axis position of said imaging system.

6. An illumination apparatus, comprising:
    a light source;
    an elliptical mirror for forming an image of said light source;
    an imaging system for re-imaging, in a predetermined state, the image formed by said elliptical mirror;
    a multi-beam generating system for producing, from a light beam emitted from said light source, a number of discrete light beams, said multi-beam generating system having an input surface disposed in a predetermined relation to the image of said light source formed by said imaging system; and
    a collimating system for collimating each of the discrete light beams emerging from said multi-beam generating system.

7. An apparatus according to claim 6, wherein said imaging system is effective to define, between an on-axis portion and an off-axis portion, optimum focus positions which are displaced from each other.

8. An illumination apparatus for illuminating a plane, said apparatus comprising:
    a light source;
    an imaging system for forming an image of said light source, while causing a curvature of field;
    a multi-beam generating system for producing, from a light beam emitted from said light source, a number of discrete light beams, said multi-beam generating system having an input surface disposed in a predetermined relation to the image of said light source formed by said imaging system; and
    optical means for directing each of the light beams from said multi-beam generating system to the plane to be illuminated.

* * * * *

UNITED STATES PATENT AND TRADEMARK OFFICE
CERTIFICATE OF CORRECTION

PATENT NO. : 4,683,524
DATED : July 28, 1987
INVENTOR(S) : MASAKATSU OHTA

It is certified that error appears in the above-identified patent and that said Letters Patent is hereby corrected as shown below:

AT [56] UNDER REFERENCES CITED/U.S. PATENT DOCUMENTS

Line 9, "Pryer" should read --Pryor--.

AT [56] UNDER REFERENCES CITED/FOREIGN PATENT DOCUMENTS

Line 1, "56-813" should read --56-81813--.

COLUMN 2

Line 8, "intesity" should read --intensity--.

COLUMN 5

Line 51, "generting" should read --generating--.

Signed and Sealed this

First Day of December, 1987

Attest:

DONALD J. QUIGG

Attesting Officer      Commissioner of Patents and Trademarks